US009205443B2

(12) United States Patent
Tsai et al.

(10) Patent No.: US 9,205,443 B2
(45) Date of Patent: Dec. 8, 2015

(54) METAL MASK MANUFACTURING METHOD AND METAL MASK

(71) Applicant: FORHOUSE CORPORATION, Taichung (TW)

(72) Inventors: Kuan-Tao Tsai, Pingtung County (TW); Chien-Hung Lai, Chiayi County (TW); Ching-Yuan Hu, Kaohsiung (TW); Ching-Feng Li, Changhua (TW); Chia-Hsu Tu, Taichung (TW); Kun-Chih Pan, Taichung (TW)

(73) Assignee: DARWIN PRECISIONS CORPORATION, Taichung (TW)

( * ) Notice: Subject to any disclaimer, the term of this patent is extended or adjusted under 35 U.S.C. 154(b) by 0 days.

(21) Appl. No.: 14/561,993

(22) Filed: Dec. 5, 2014

(65) Prior Publication Data

US 2015/0159283 A1 Jun. 11, 2015

(30) Foreign Application Priority Data

Dec. 6, 2013 (TW) .............................. 102144941 U

(51) Int. Cl.
*C23F 17/00* (2006.01)
*B05B 15/04* (2006.01)
*C23F 1/02* (2006.01)
*G03F 1/80* (2012.01)

(52) U.S. Cl.
CPC ................ *B05B 15/045* (2013.01); *C23F 1/02* (2013.01); *G03F 1/80* (2013.01)

(58) Field of Classification Search
None
See application file for complete search history.

(56) References Cited

U.S. PATENT DOCUMENTS

| 4,689,114 A | 8/1987 | Ohtake et al. |
| 2011/0027461 A1* | 2/2011 | Matsudate ............ C23C 14/042 427/67 |

FOREIGN PATENT DOCUMENTS

CN 101988181 3/2011

\* cited by examiner

*Primary Examiner* — Khaja Ahmad
(74) *Attorney, Agent, or Firm* — Muncy, Geissler, Olds & Lowe, P.C.

(57) ABSTRACT

A metal mask manufacturing method includes: (a) disposing a first anti-etching layer having a first void region on a first face of a substrate; (b) disposing a second anti-etching layer on a second face of the substrate opposite to the first face, wherein a second void region of the second anti-etching layer is corresponding to the first void region; (c) performing a first etching on the first face and the second face to form a first concave part and a second concave part separated by a part of the substrate; (d) disposing a protecting layer filled into the first concave part; (e) performing a second etching from the second face to produce a void between the first concave part and the second concave part; (f) removing the second anti-etching layer; and (g) performing a third etching from the second face.

17 Claims, 6 Drawing Sheets

METAL MASK MANUFACTURING METHOD AND METAL MASK

BACKGROUND OF THE DISCLOSURE

1. Field of the Disclosure

This disclosure generally relates to a metal mask manufacturing method and a metal mask manufactured by using the same. More specific, this disclosure relates to a metal mask manufacturing method for film coating and a metal mask used in film coating and manufactured by using the same.

2. Background

Metal masks are tools commonly used in manufacturing processes such as semiconductor manufacturing process and MEMS (Microelectromechanical Systems) manufacturing process. Metal masks can be used to form required structures in processes such as vapor deposition, sputtering, screen printing. Generally speaking, metal masks are metal substrates formed with required openings at specific locations; film coating materials can be formed as specific patterns on the substrates through the openings.

As shown in FIG. 1A, due to the restriction in the manufacturing process, conventional metal masks have large bottom face angle γ (about 50-55 degrees) and small opening 40, wherein this kind of structure easily impedes the film coating material transmitted by the film coating material source 600 and is adverse to the control of the film thickness uniformity and the focus of the film coating material source 600. On the other hand, to make smaller bottom angles upon the premises of same size of opening 40, the distribution density of the openings would be lower. As shown in FIG. 1B, the openings 40 in the metal mask 80 and the metal mask 80' are same in size, while the distribution density of the opening 40 of the metal mask 80' is obviously smaller than the distribution density of the opening 40 of the metal mask 80.

SUMMARY

In accordance with aspects of the present disclosure, a metal mask manufacturing method is provided.

The metal mask manufacturing method includes (a) disposing a first anti-etching layer having a first void region on a first face of a substrate; (b) disposing a second anti-etching layer on a second face of the substrate opposite to the first face, wherein a second void region of the second anti-etching layer is corresponding to the first void region; (c) performing a first etching on the first face and the second face to respectively form a first concave part on the first face at the area exposed by the first void region and a second concave part on the second face at the area exposed by the second void region, wherein the first concave part and the second concave part are separated by a portion of the substrate; (d) disposing a protecting layer filled into the first concave part; (e) performing a second etching from the second face to produce a void between the first concave part and the second concave part; (f) removing the second anti-etching layer; and(g) performing a third etching from the second face.

Step (b) includes making the lateral width of the second void region larger than the lateral width of the first void region. Step (e) includes stopping the second etching when the lateral width of the void is close to the maximum lateral width of the first concave part. The third etching of the step (g) includes a sputter etching facing to the second face. In step (g), a micro structure wall is formed by etching the inner wall of the second void region, wherein the third etching is stopped when the angle between the micro structure wall and the first face is smaller than 40 degrees. The third etching in step (g) is stopped when the curvature radius of the micro structure wall is larger than 500 μm.

The metal mask is manufactured by the method mentioned above. The metal mask includes a plurality of micro structures. The adjacent micro structures have a gap. Each micro structure has a bottom face and at least a micro structure wall. The bottom face is a part of the first face. The angle between the micro structure wall and the bottom face is smaller than 40 degrees. The angle between the micro structure wall and the bottom face is larger than 20 degrees. The curvature radius of the micro structure wall is larger than 500 μm. The lateral width of the gap is not less than half of the lateral width of the bottom face.

Accordingly, the metal mask manufacturing method of the present disclosure can be used to manufacture metal masks having a smaller bottom face angle and larger openings, which are beneficial to the control of the film thickness uniformity in the following film coating process as well as the focus of the film coating material source, hence to overcome the difficulty in the prior art.

In accordance with other aspects of the present disclosure, a metal mask having a smaller bottom face angle and larger openings is provided for improving the control of the film thickness uniformity in the following film coating process as well as for accommodating the focus of the film coating material source.

It is to be understood that the above description and the embodiments below are merely illustrative and are not to be considered limitations to the scope of the invention.

DETAILED DESCRIPTION

Figure 1A:
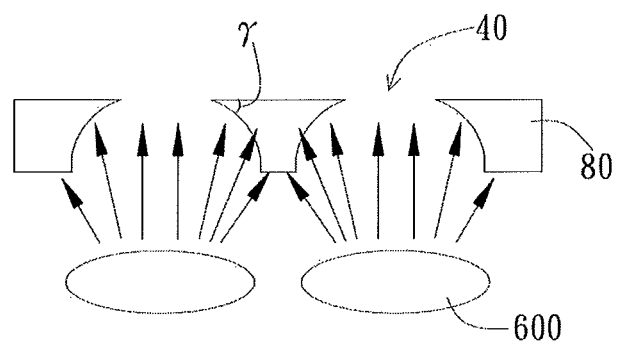
FIGS. 1A and 1B are schematic views of the prior art.
Figure 1B:
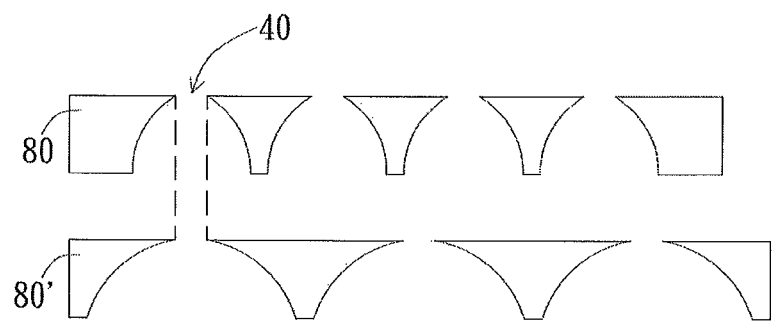
Figure 2:
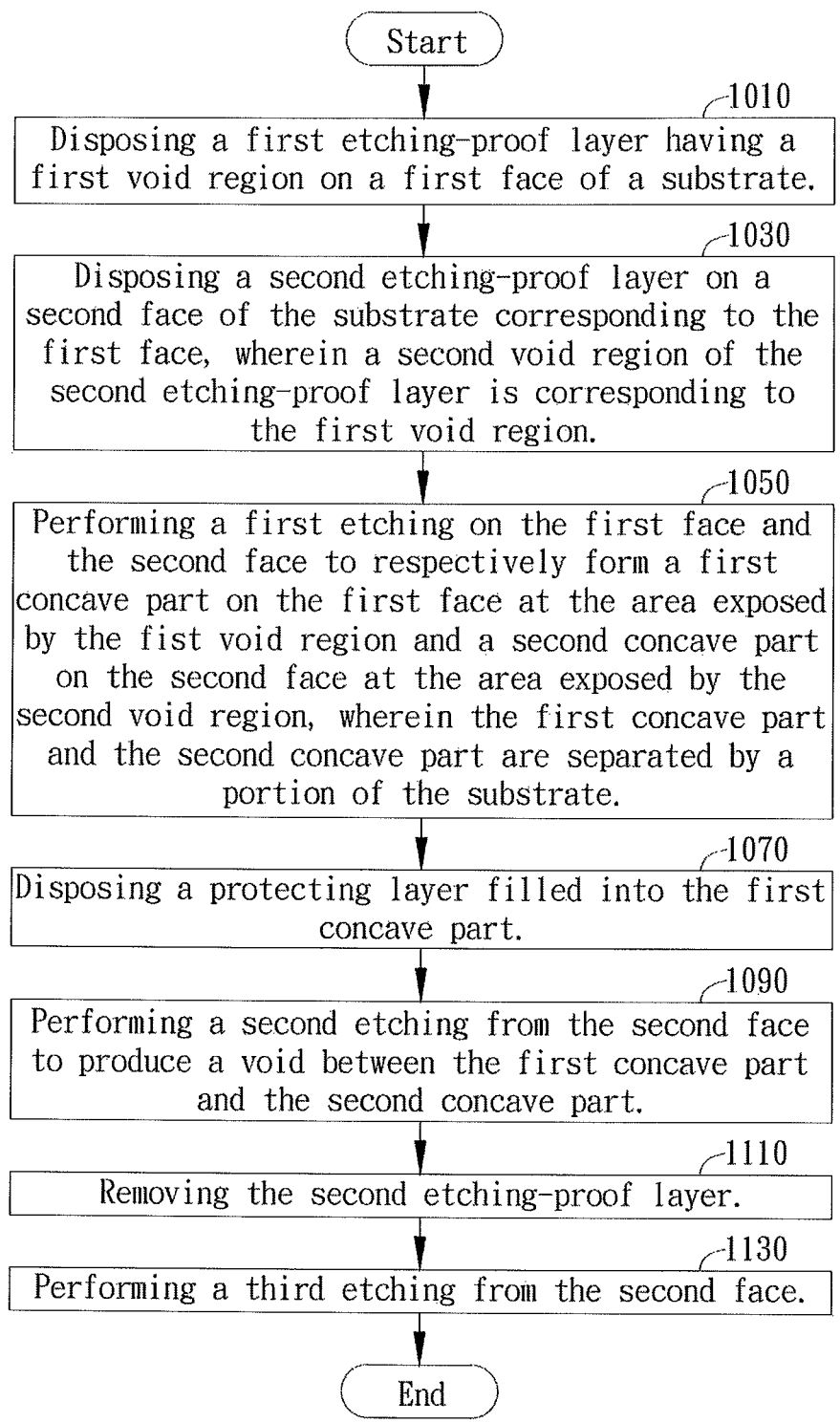
FIG. 2 is a flow chart of the preferred embodiment of the present invention.

As the preferred embodiment shown in FIG. 2, the metal mask manufacturing method of the present invention includes the following steps.

Figure 3:
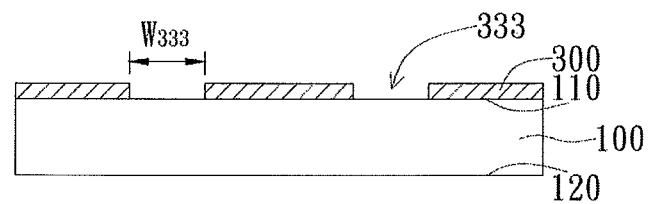
FIG. 3 is a schematic view of an embodiment of a first anti-etching layer having a first void region disposed on a first face of a substrate.

Step 1010 involves the step of disposing a first anti-etching layer 300 having a first void region 333 on a first face 110 of a substrate 100. More particularly, as shown in FIG. 3, the first anti-etching layer 300 having the first void region 333 is disposed on the first face 110 of the substrate 100. The substrate 100 is preferably selected from gold, silver, copper, aluminum, nickel, or alloys thereof and more preferably is a nickel-iron alloy. The first anti-etching layer 300 is preferably a photoresist, which can be disposed on the first face 110 by spin coating, spraying, plating, etc., and is formed with the first void region 333 by photolithography process. The first void region 333 can be oriented either regularly or irregularly depending on the manufacturing and design requirements.

Figure 4:
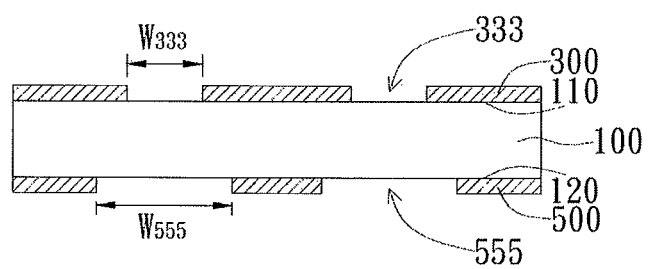
FIG. 4 is a schematic view of an embodiment of a second anti-etching layer having a second void region disposed on a second face of a substrate.

Step 1030 involves the step of disposing a second anti-etching layer 500 on a second face 120 of the substrate opposite to the first face 110, wherein a second void region 555 of the second anti-etching layer 500 is corresponding to the first void region 333. More particularly, as shown in FIG. 4, the second anti-etching layer 500 having the second void region 555 is disposed on the second face 120 of the substrate 100. The vertical projection of the second void region 555 of the second anti-etching layer 500 on the first face 110 overlaps the first void region 333. The second anti-etching layer 500 is preferably a photoresist, which can be disposed on the second face 120 by spin coating, spraying, or plating, and is formed with the second void region 555 by photolithography process. In the preferred embodiment, step 1030 includes making the lateral width $W_{555}$ of the second void region 555 larger than the lateral width $W_{333}$ of the first void region 333.

Figure 5:
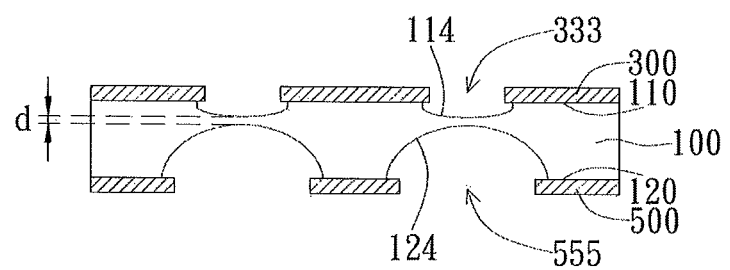
FIG. 5 is a schematic view of an embodiment of forming a first concave part and a second concave part.

Step 1050 involves the step of performing a first etching on the first face 110 and the second face 120 to respectively form a first concave part 114 on the first face 110 at the area exposed by the first void region 333 and a second concave part 124 on the second face 120 at the area exposed by the second void region 555, wherein the first concave part 114 and the second concave part 124 are separated by a portion of the substrate 100. More particularly, the substrate 100, as shown in FIG. 4, having the first anti-etching layer 300 and the second anti-etching layer 500 disposed on its opposite faces is immersed in an etching solution for a certain period of time. By intentionally exposing a specific area of the first face 110 by the first void region 333 and therefore is not protected by the first anti-etching layer 300, the etching solution is able to etch the substrate 100 through the exposed area to form the first concave part 114 shown in FIG. 5. Similarly, by intentionally exposing a specific area of the second face 120 by the second void region 555 and therefore is not protected by the second anti-etching layer 500, the etching solution is able to etch the substrate 100 through the exposed area to form the second concave part 124. The time for immersing the substrate 100 in the etching solution depends on the requirement of the depth and the curvature of the first concave part 114 and the second concave part 124 to be formed, as well as the depth d of the portion of the substrate 100 that separates the first concave part 114 and the second concave part 124. In different embodiments, the first face 110 and the second face 120 can be etched by sputter etching, plasma etching, etc.

Figure 6A:
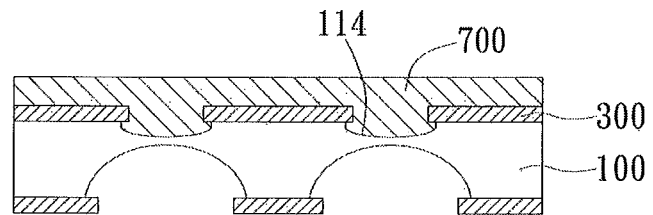
FIGS. 6A and 6B are schematic views of embodiments of disposing a protecting layer filled into the first concave part.
Figure 6B:
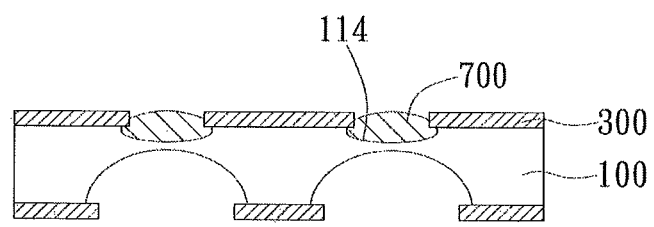

Step 1070 involves the step of disposing a protecting layer 700 filled into the first concave part 114. More particularly, as shown in FIG. 6A, the protecting layer 700 is disposed on the other face of the first anti-etching layer 300 corresponding to the substrate 100 by spin coating, spraying, plating, etc., and is filled into the first concave part 114. In a different embodiment shown in FIG. 6B, however, considering the requirements of manufacturing process, e.g. the difficulty of removing the protecting layer 700 or performing further process on the first anti-etching layer 300, or decreasing the material cost of the protecting layer 700, the disposing location and filling amount of the protecting layer 700 is further controlled to directly fill into the first concave part 114 without overlapping the first anti-etching layer 300.

Figure 7:
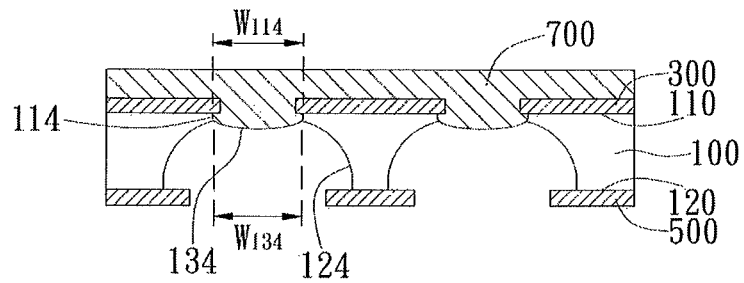
FIG. 7 is a schematic view of an embodiment of producing a void.

Step 1090 involves the step of performing a second etching from the second face 120 to produce a void 134 between the first concave part 114 and the second concave part 124. More particularly, as shown in FIG. 6A, the substrate 100 having the protecting layer 700 is immersed in an etching solution for a certain period of time. Since the second void region 555 is not protected by the protecting layer 700 and is exposed in the etching solution, the substrate 100 is etched continuously by the etching solution, which makes the second concave part 124 enlarge toward the first face 110 from the second face 120. The etching solution etches the portion of the substrate 100 that separates the first concave part 114 and the second concave part 124, and forms the void 134 as shown in FIG. 7. The second etching is preferably stopped when the lateral width $W_{134}$ of the void 134 is equal to the maximum lateral width $W_{114}$ of the first concave part 114 or the lateral width $W_{134}$ of the void 134 is close to, but slightly smaller than, the maximum lateral width $W_{114}$ of the first concave part 114. In other words, in the preferred embodiment, when the lateral width $W_{134}$ of the void 134 is equal to the maximum lateral width $W_{114}$ of the first concave part 114 or the lateral width $W_{134}$ of the void 134 is close to, but slightly smaller than, the maximum lateral width $W_{114}$ of the first concave part 114, the substrate 100 can be taken out of the etching solution and be rinsed to stop the etching. In different embodiments, the second etching can be performed by sputter etching or plasma etching from the second face.

Figure 8:
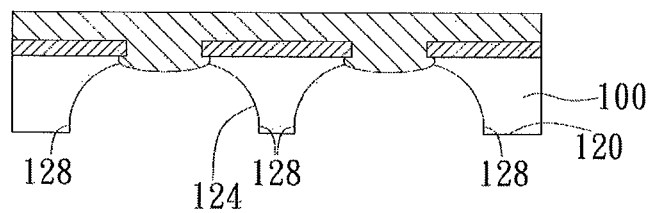
FIG. 8 is a schematic view of an embodiment of a structure exposing the second face and the second concave part.

Step 1110 involves the step of removing the second anti-etching layer 500. More particularly, the second anti-etching layer 500 shown in FIG. 7 can be stripped by mechanical force to form a structure exposing the second face 120 and the second concave part 124 as shown in FIG. 8. In different embodiments, the second anti-etching layer 500 can be removed by photolithography process or etching.

Step 1130 involves the step of performing a third etching from the second face. More particularly, a sputter etching toward the second face 120 is performed to the substrate 100 having the protecting layer 700, which makes the second concave part 124 enlarge toward the first face 110 from the second face 120 and the second face 120 is etched to form the structure shown in FIG. 9. In different embodiments, however, the substrate 100 having the protecting layer 700 shown in FIG. 8 is immersed in an etching solution for a certain period of time. Since the second face 120 and the second concave part 124 are not protected by the protecting layer 700 and are exposed in the etching solution, the substrate 100 is etched continuously by the etching solution, which makes the second concave part 124 enlarge toward the first face 110 from the second face 120. The second face 120 is also etched by the etching solution to form the micro structure 180 shown in FIG. 9.

Figure 9:
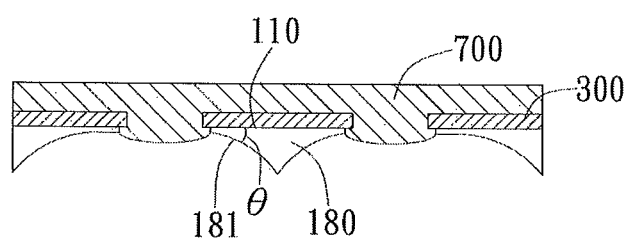
FIG. 9 is a schematic view of an embodiment of performing a third etching from the second face to form micro structures.
Figure 10:
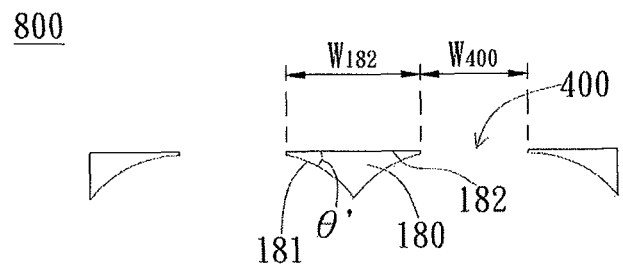
FIG. 10 is a schematic view of an embodiment of the metal mask of the present invention.

Taking a different point of view, in step 1130, a micro structure wall 181 of the micro structure 180 as shown in FIG. 9 is formed by etching the inner face of the second void region 555 (see FIG. 4). In one embodiment, the third etching is stopped when the angle θ between the micro structure wall 181 and the first face 110 is smaller than 40 degrees. In different embodiments, the third etching is stopped when the curvature radius of the micro structure wall 181 is larger than 500 μm. After the third etching is stopped, the protecting layer 700 and the first anti-etching layer 300 can be removed by processes such as photolithography, mechanical stripping or etching to form a metal mask 800 including a plurality of micro structures 180, as shown in FIG. 10. The adjacent micro structures 180 have a gap 400. Each micro structure 180 includes a bottom face 182 and at least a micro structure wall 181. The bottom face 182 is a part of the first face 110 (see FIG. 9). In the preferred embodiment, the angle θ' between the micro structure wall 181 and the bottom face 182 is between 20 and 40 degrees. The curvature radius of the micro structure wall is preferably larger than 500 μm. The lateral width $W_{400}$ of the gap 400 is not less than half of the lateral width $W_{182}$ of the bottom face 182.

Figure 11:
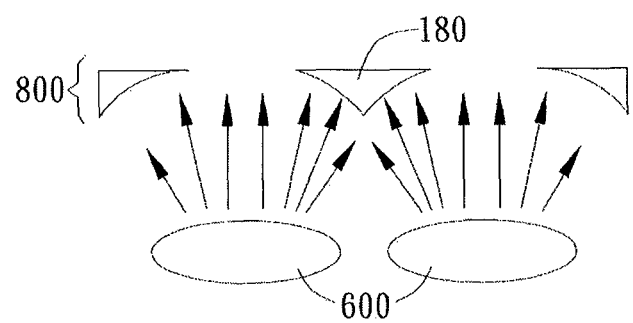
FIG. 11 is a schematic view of an embodiment of using the metal mask of the present invention in a film coating process.

More particularly, in the etching process, the etching speed of a protrusion or an acute corner is higher than that of a plane or a curved surface. Thus, in the third etching, the etching speed of the acute corner 128 in FIG. 8 is higher than that of the second concave part 124, wherein the etching speed of the second concave part 124 is lower at the location near 700 and higher at the location away from 700. Accordingly, the metal mask as shown in FIG. 10 can be formed by the metal mask manufacturing method of the present invention, wherein the metal mask has a smaller bottom face angle, i.e. the angle θ' between the micro structure wall 181 and the bottom face 182 is between 20 and 40 degrees, and larger openings, i.e. the lateral width $W_{400}$ of the gap 400 is not less than half of the lateral width $W_{182}$ of the bottom face 182. That is, for the metal mask, the same distribution density of the openings could be obtained while having a smaller bottom face angle and larger openings. As the embodiment shown in FIG. 11, the metal mask having a smaller bottom face angle and larger openings will not impede the film coating material from the film coating material source 600 and is benefit to the control of the film thickness uniformity and the focus of the film coating material source 600.

Although the preferred embodiments of the present disclosure have been described herein, the above description is merely illustrative. Further modification of the disclosure herein disclosed will occur to those skilled in the respective arts and all such modifications are deemed to be within the scope of the disclosure as defined by the appended claims.

What is claimed is:

1. A metal mask manufacturing method, comprising:
   (a) disposing a first anti-etching layer having a first void region on a first face of a substrate;
   (b) disposing a second anti-etching layer on a second face of the substrate opposite to the first face, wherein a second void region of the second anti-etching layer is corresponding to the first void region;
   (c) performing a first etching on the first face and the second face to respectively form a first concave part on the first face at the area exposed by the first void region and a second concave part on the second face at the area exposed by the second void region, wherein the first concave part and the second concave part are separated by a portion of the substrate;
   (d) disposing a protecting layer filled into the first concave part;
   (e) performing a second etching from the second face to produce a void between the first concave part and the second concave part;
   (f) removing the second anti-etching layer; and
   (g) performing a third etching from the second face.

2. The method of claim 1, wherein the step (b) includes making the lateral width of the second void region larger than the lateral width of the first void region.

3. The method of claim 2, wherein in the step (g), a micro structure wall is formed by etching the inner wall of the second void region, wherein the third etching is stopped when the angle between the micro structure wall and the first face is smaller than 40 degrees.

4. The method of claim 3, wherein in the step (g) the third etching is stopped when the curvature radius of the micro structure wall is larger than 500 μm.

5. The method of claim 2, wherein the step (e) includes stopping the second etching when the lateral width of the void is close to the maximum lateral width of the first concave part.

6. The method of claim 5, wherein in the step (g), a micro structure wall is formed by etching the inner wall of the second void region, wherein the third etching is stopped when the angle between the micro structure wall and the first face is smaller than 40 degrees.

7. The method of claim 6, wherein in the step (g) the third etching is stopped when the curvature radius of the micro structure wall is larger than 500 μm.

8. The method of claim 1, wherein the step (e) includes stopping the second etching when the lateral width of the void is close to the maximum lateral width of the first concave part.

9. The method of claim 8, wherein in the step (g), a micro structure wall is formed by etching the inner wall of the second void region, wherein the third etching is stopped when the angle between the micro structure wall and the first face is smaller than 40 degrees.

10. The method of claim 9, wherein in the step (g) the third etching is stopped when the curvature radius of the micro structure wall is larger than 500 μm.

11. The method of claim 1, wherein in the step (g), a micro structure wall is formed by etching the inner wall of the second void region, wherein the third etching is stopped when the angle between the micro structure wall and the first face is smaller than 40 degrees.

12. The method of claim 11, wherein in the step (g) the third etching is stopped when the curvature radius of the micro structure wall is larger than 500 μm.

13. A metal mask manufactured by the method of claim 1, wherein the metal mask includes a plurality of micro structures, the adjacent micro structures have a gap; wherein each micro structure comprises:
   a bottom face being a part of the first face; and
   at least a micro structure wall, wherein the angle between the micro structure wall and the bottom face is smaller than 40 degrees.

14. The metal mask of claim 13, wherein the angle between the micro structure wall and the bottom face is larger than 20 degrees.

15. The metal mask of claim 13, wherein the curvature radius of the micro structure wall is larger than 500 μm.

16. The metal mask of claim 13, wherein the lateral width of the gap is not less than half of the lateral width of the bottom face.

17. The method of claim 1, wherein the third etching of the step (g) includes a sputter etching facing to the second face.

* * * * *